(12) United States Patent
Trivedi

(10) Patent No.: US 8,264,295 B2
(45) Date of Patent: Sep. 11, 2012

(54) SWITCHED VARACTOR CIRCUIT FOR A VOLTAGE CONTROLLED OSCILLATOR

(75) Inventor: Vishal P. Trivedi, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 84 days.

(21) Appl. No.: 12/872,532

(22) Filed: Aug. 31, 2010

(65) Prior Publication Data
US 2012/0049967 A1    Mar. 1, 2012

(51) Int. Cl.
    *H03B 5/12*    (2006.01)
(52) U.S. Cl. .................................. 331/177 V; 331/36 C
(58) Field of Classification Search .............. 331/177 V, 331/36 C
    See application file for complete search history.

(56) References Cited

U.S. PATENT DOCUMENTS

| | | | |
|---|---|---|---|
| 3,889,210 A | 6/1975 | Matsuura et al. | |
| 4,786,903 A | 11/1988 | Grindahl et al. | |
| 5,625,325 A * | 4/1997 | Rotzoll et al. | 331/16 |
| 5,648,744 A * | 7/1997 | Prakash et al. | 331/11 |
| 6,114,923 A | 9/2000 | Mizutani | |
| 6,281,758 B1 | 8/2001 | Elsayed et al. | |
| 6,288,620 B1 | 9/2001 | Atokawa et al. | |
| 6,292,063 B1 | 9/2001 | Tanemura et al. | |
| 6,927,643 B2 | 8/2005 | Lazarescu et al. | |
| 7,538,643 B2 | 5/2009 | Mizutani | |
| 7,564,318 B2 * | 7/2009 | Chen | 331/177 V |
| 7,889,023 B2 | 2/2011 | Mun et al. | |
| 2011/0273248 A1 * | 11/2011 | Nicolson et al. | 333/81 A |

FOREIGN PATENT DOCUMENTS

JP    11-074703 A    3/1999

OTHER PUBLICATIONS

U.S. Appl. No. 12/769,046, 'Switched Varactor Circuit for Voltage Controlled Oscillator', Inventor Vishal P. Trivedi, filed Aug. 31, 2010, Office Action—Rejection, mailed Jul. 19, 2011.
U.S. Appl. No. 12/769,046, "Switched Capacitor Circuit for a Voltage Controlled Oscillator", filed Apr. 28, 2010, Inventor, Vishal P. Trivedi.
U.S. Appl. No. 12/769,046 Office Action Rejection dated Oct. 31, 2011.

* cited by examiner

*Primary Examiner* — Joseph Chang
(74) *Attorney, Agent, or Firm* — James L. Clingan, Jr.; Joanna G. Chiu

(57) ABSTRACT

A switched varactor circuit for use at least one operating frequency comprises a first resistive element having a first terminal and a second terminal, wherein the first terminal is coupled to receive a switching voltage; a hetero-junction bipolar transistor (HBT) having a base terminal, a first conducting terminal, and a second conducting terminal, wherein the base terminal of the HBT is coupled to a second terminal of the resistive element, and wherein the first conducting terminal is coupled to a first circuit node; and a first varactor having an anode coupled to the second conductive terminal of the HBT and a cathode coupled to a second circuit node, and wherein a capacitance value at the first circuit node is a function of the switching voltage.

16 Claims, 2 Drawing Sheets

SWITCHED VARACTOR CIRCUIT FOR A VOLTAGE CONTROLLED OSCILLATOR

CROSS-REFERENCE TO RELATED APPLICATION(S)

This application is related to U.S. patent application Ser. No. 12/769,046, filed Apr. 28, 2010, titled "SWITCHED CAPACITOR CIRCUIT FOR A VOLTAGE CONTROLLED OSCILLATOR," naming Vishal P. Trivedi as inventor, and assigned to the current assignee hereof.

BACKGROUND

1. Field

This disclosure relates generally to varactor circuits, and more specifically, to varactor circuits for a voltage controlled oscillator.

2. Related Art

Voltage controlled oscillators (VCOs) are increasingly required to provide a wide range of frequencies. Such VCOs are also required to operate with a high degree of accuracy despite process, voltage, and temperature variations. These constraints can be difficult to satisfy in VCOs that are used at extremely high frequencies (e.g., in the range of frequencies from 30 to 300 gigahertz). This high range of frequencies corresponds to a wavelength of one to ten millimeters, which is also referred to as the millimeter wave (mmW) band. The capacitance provided preferably takes up little space and also the circuits for implementing the use of the capacitance should also not take up too much space.

Accordingly, there is a need for capacitor circuits for a voltage controlled oscillator that improve upon one or more of the issues raised above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a switched varactor circuit for use at multiple operating frequencies is provided. The switched varactor is switched into operation for one frequency and switched out for another frequency. The reuse of most of the circuit provides for efficient use of space. This is better understood by reference to the drawings and the following specification.

Figure 1:
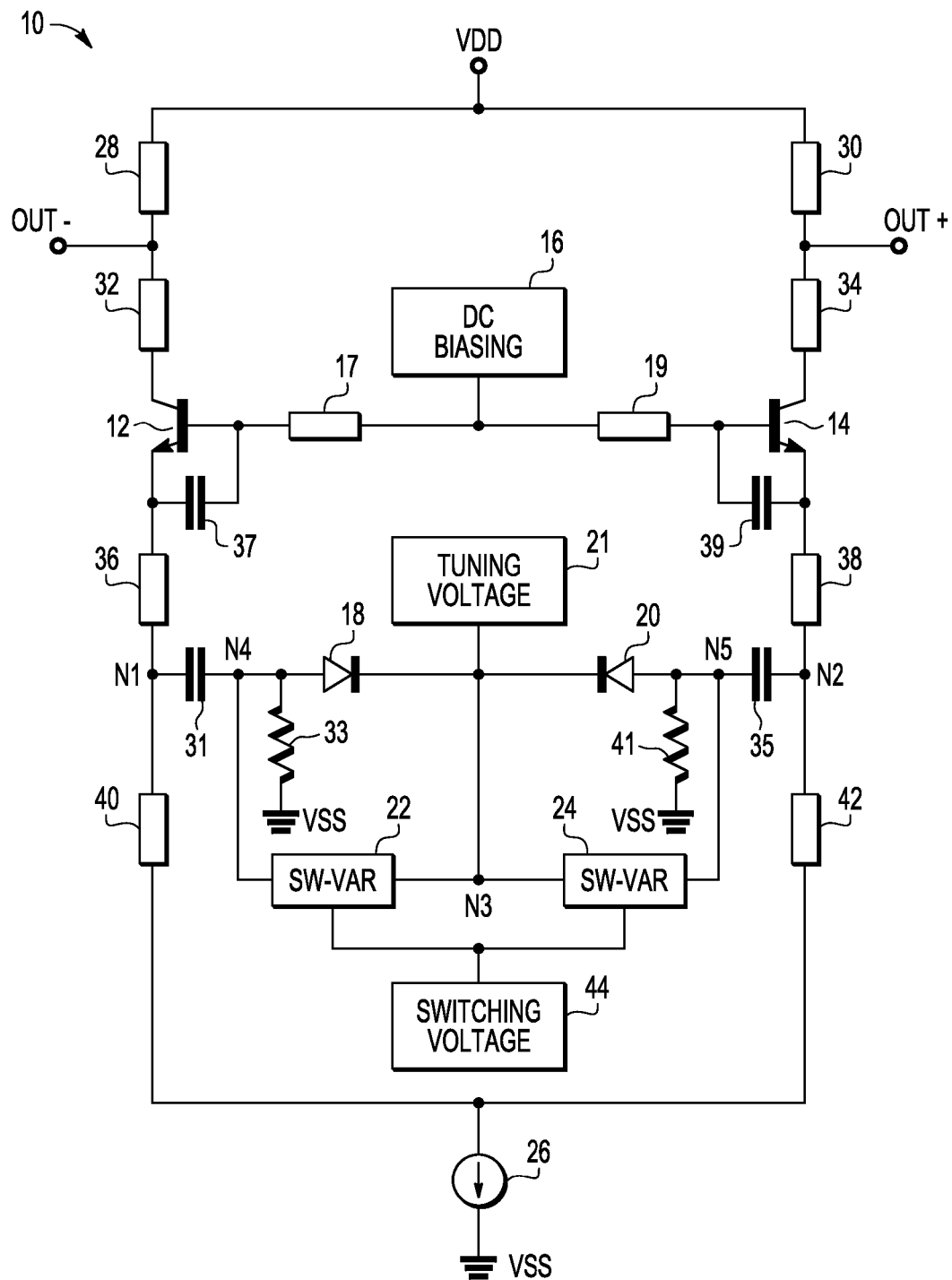
FIG. 1 is a schematic diagram of an exemplary differential voltage controlled oscillator (VCO) with switched varactors.

FIG. 1 is a schematic diagram of an exemplary differential voltage controlled oscillator (VCO) 10 with switched varactor circuits 22 and 24. In one embodiment, differential VCO 10 may be configured as a Colpitts VCO. Differential VCO 10 may include transistors 12 and 14. Differential VCO 10 may further include a DC biasing source 16 that may be used to provide a DC bias to transistors 12 and 14. By way of example, the base terminal of transistor 12 may be coupled to DC biasing source 16 via a transmission line 17. Similarly, the base terminal of transistor 14 may be coupled to DC biasing source 16 via a transmission line 19. Transmission lines 17 and 19 form the main inductive elements of the LC tank of the oscillator. The collector terminal of transistor 12 may be coupled to an output terminal (labeled OUT−) via a transmission line 32. The collector terminal of transistor 14 may be coupled to an output terminal (labeled OUT+) via a transmission line 34. The output terminal, labeled as OUT−, may be coupled to a voltage supply VDD via a transmission line 28. The output terminal, labeled as OUT+, may be coupled to the voltage supply VDD via a transmission line 30. A capacitor 37 may be coupled between the base terminal and the emitter terminal of transistor 12. Another capacitor 39 may be coupled between the base terminal and the emitter terminal of transistor 14. VCO 10 also includes capacitor 31, resistor 33, capacitor 35, and resistor 41.

With continued reference to FIG. 1, the emitter terminal of transistor 12 may be coupled to node N1 via a transmission line 36. The emitter terminal of transistor 14 may be coupled to node N2 via a transmission line 38. Differential VCO 10 may further include varactor diodes 18 and 20, which may be tuned using a tuning voltage received from a tuning voltage source 21. One terminal of varactor diode 18 may be coupled to a node N4 and the other terminal may be coupled to varactor diode 20 and may further be coupled to tuning voltage source 21. One terminal of varactor diode 20 may be coupled to a node N5 and the other terminal may be coupled to varactor diode 18 and to tuning voltage source 21. Capacitor 31 may have a first terminal coupled to node N4 and a second terminal to node N1. Resistor 33 may have a first terminal coupled to node N4 and a second terminal coupled to ground. Capacitor 35 may have a first terminal coupled to node N5 and a second terminal to node N2. Resistor 37 may have a first terminal coupled to node N5 and a second terminal coupled to ground. Differential VCO 10 may further include switched varactor circuits 22 and 24. Differential VCO 10 may further include a switching voltage source 44. Switched varactor circuit 22 may be coupled between node N4 and node N3. Switched varactor circuit 24 may be coupled between node N5 and node N3. Node N3 may be coupled to tuning voltage source 21 for receiving the tuning voltage source, such that each of the switching varactor circuits 22 and 24 may receive the tuning voltage. Switched varactor circuits 22 and 24 may be coupled to switching voltage source 44 for receiving a switching voltage. Node N1 may be coupled to a voltage supply terminal VSS via a transmission line 40 and a bias current source 26. Node N2 may be coupled to the voltage supply terminal VSS via transmission line 42 and bias current source 26. Although FIG. 1 describes the switched varactor circuits being used in a differential VCO application, these might be used in other applications, such as tunable phase shifters/rotators. Although FIG. 1 shows a specific number of components arranged in a certain manner, differential VCO 10 may include additional or fewer components arranged differently.

In operation, switched varactor circuits 22 and 24 may be used for two different applications. In one application, switched varactor circuits 22 and 24 may be used to vary the capacitance of the LC tank of differential VCO 10 to support two ranges of frequencies (or bands). For example, based on whether switched varactor circuits 22 and 24 are in one state or another state, differential VCO 10 may operate in two different bands. By way of example, when switched varactor circuits 22 and 24 are configured to keep a varactor providing capacitance to node N4 then the differential VCO may operate in one band (e.g., 76-77 GHz). On the other hand, when the switched varactor circuits are configured to prevent a varactor from providing capacitance to node N4, the differential VCO may operate in another band (e.g., 77-81 GHz). In another application, switched varactor circuits 22 and 24 may be used to vary the capacitance of the LC tank of differential VCO 10 to adjust for deviations in the frequency of differential VCO 10 as a result of process, voltage, and/or temperature variations. Parallel combination of multiple sets of switches with corresponding voltage sources can also be used for operating in multiple different frequency bands or for making additional adjustments of process, voltage, and/or temperature variations. Additional details regarding the operation of switched varactor circuits 22 and 24 are provided below.

Figure 2:
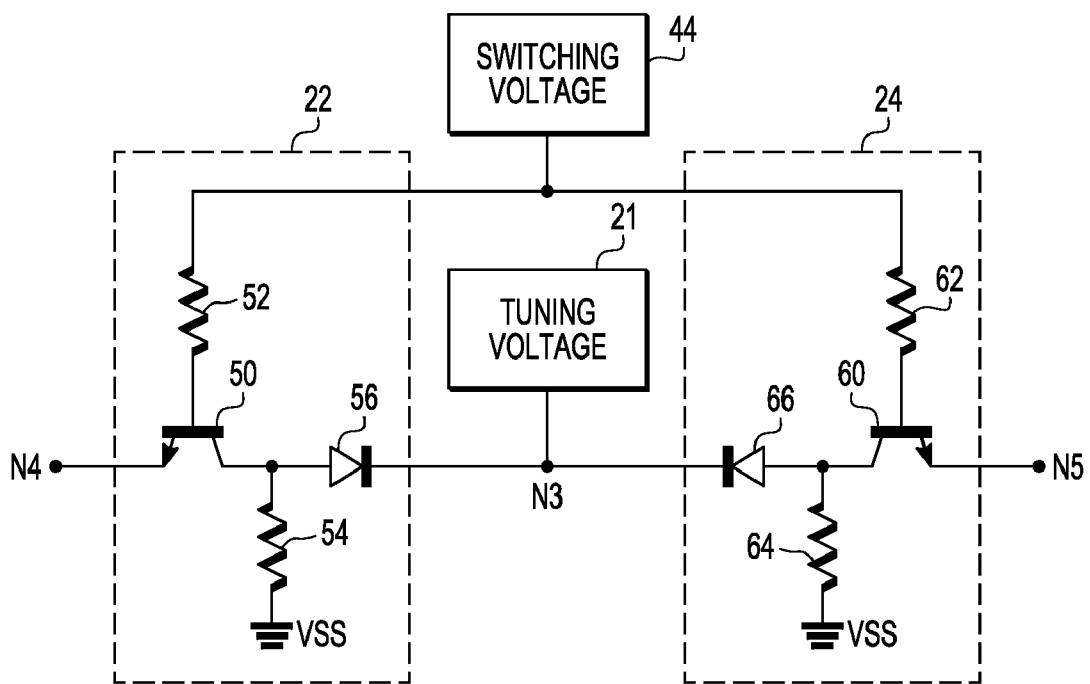
FIG. 2 is a schematic diagram of a portion of the exemplary differential VCO of FIG. 1 with exemplary switched varactors.

FIG. 2 is a schematic diagram of a portion of the VCO of FIG. 1 including exemplary switched varactor circuits 22 and 24 of FIG. 1. By way of example, switched varactor circuit 22 may include a resistor 52, a hetero-junction bipolar transistor (HBT) 50, a diode 56 functioning as a varactor and may be called varactor 56, and a resistor 54. A cathode of varactor 56 may be coupled to node N3 (node N3 is shown in FIG. 1). An anode of varactor 56 may be coupled to a collector of HBT 50. An emitter of HBT 50 may be coupled to node N4. A base of HBT 50 may be coupled to a first terminal of resistor 52. A second terminal of resistor 52 may be coupled to switching voltage source 44 for receiving the switching voltage. Switching voltage source 44 may provide a switching voltage based on a control signal (e.g., a switching control signal). Tuning voltage source 21 may include elements, such as de-coupling capacitors to provide an AC ground at node N3. Resistor 54 may have a first terminal coupled to the anode of varactor 56 and a second terminal coupled to ground. In one embodiment, the application of the switching voltage may determine whether HBT 50 is substantially conducting or substantially non-conducting. When the switching voltage is approximately zero, HBT 50 may be substantially non-conducting. When HBT 50 is substantially non-conducting, then both base-to-emitter and base-to-collector junctions are off. This means that minimal capacitance is provided at node N4 by switched varactor circuit 22. This means that differential VCO 10 is operating in a first frequency band (e.g. 77-81 GHz). When the switching voltage is above the turn-on voltage of the base-to-emitter junction, HBT 50 is in substantially conducting mode. This means that capacitance of varactor 56 is present at node N4. This means that the capacitance of varactor 56 is added to that of varactor 18 at node N4 and differential VCO 10 of FIG. 1 is operating in a second frequency band (e.g., 76-77 GHz).

With continued reference to FIG. 2, as an example, to facilitate the differential operation of differential VCO of FIG. 1, switched varactor circuit 24 is implemented as a mirror-image of switched varactor circuit 22. Switched varactor circuit 24 may include a resistor 62, a hetero-junction bipolar transistor (HBT) 60, a diode 66 functioning as a varactor and may be called varactor 66, and a resistor 64. A first terminal of varactor 66 may be coupled to node N3 (node N3 is shown in FIG. 1). A second terminal of varactor 66 may be coupled to the collector of HBT 60. An emitter of HBT 60 may be coupled to node N5. A base of HBT 60 may be coupled to a first terminal of resistor 62. A second terminal of resistor 62 may be coupled to switching voltage source 44 for receiving the switching voltage. Resistor 64 may have a first terminal coupled to the anode of varactor 66 and a second terminal coupled to ground. In one embodiment, the application of the switching voltage may determine whether HBT 60 is substantially conducting or substantially non-conducting. When the switching voltage is approximately zero, HBT 60 may be substantially non-conducting. When HBT 60 is substantially non-conducting, then both base-to-emitter and base-to-collector junctions are off. This means that the capacitance provided to node N5 by switched varactor circuit 24 is minimal. In operation, switched varactor circuit 24 behaves in the same manner as switched varactor circuit 22.

Resistors 54 and 64 are high impedance compared to the impedance of varactors 56 and 66 at the operating frequencies. In effect, during A.C. operation, resistors 54 and 64 are seen as very high impedance. Resistors 54 and 64 provide a D.C. bias that allows control of the reverse bias, and thus the capacitance, of varactors 56 and 66. Resistors 52 and 62 are similarly chosen to be high impedance compared to the impedance of varactors 56 and 66 at the operating frequencies.

Node N4 is effectively the same as node N1 for A.C. operation because the capacitance of capacitor 31 is chosen to be large compared to the capacitance of varactors 18 and 56. At the operating frequencies, the impedance of capacitor 31 is minimal compared to the impedance of varactors 18 and 56. This is true for nodes N5 and N2 as well for the same reason.

This shows that additional capacitance can be added using switched varactors 22 and 24 to effect a mode change by causing a change in the frequency of operation with minimal additional circuitry. Also, when the capacitance of varactors 56 and 66 are not included, there is minimal impact on the operation of the VCO. Also, varactors 18 and 20 are implemented in symmetrical fashion to the implementation of varactors 56 and 66 so that process variations have symmetrical impact on the two modes of operation of the VCO.

In operation, to address process, voltage, and/or temperature variations, switching voltage control signal may be received from a device that can be used to detect (alone or in combination with other sensors/devices) any changes in process, voltage, and/or temperature. The switching voltage control signal may be supplied to switched varactor circuits 22 and 24. This way, the variation in the frequency generated by differential VCO 10 may be adjusted to be closer to the default range of differential VCO 10. Similarly, to provide frequencies in a different band, switching voltage control signal may be generated to provide a control signal to switching voltage source 44.

By now it should be appreciated that there has been provided a switched varactor circuit for use at least one operating frequency. The switched varactor circuit includes a first resistive element having a first terminal and a second terminal, wherein the first terminal is coupled to receive a switching voltage. The switched varactor circuit further includes a bipolar transistor having a base terminal, a first conducting terminal, and a second conducting terminal, wherein the base terminal of the bipolar transistor is coupled to a second terminal of the first resistive element, and wherein the first conducting terminal is coupled to a first circuit node. The switched varactor circuit further includes a first varactor having an anode coupled to the second conducting terminal of the bipolar transistor and a cathode coupled to a second circuit node, and wherein a capacitance value at the first circuit node is a function of the switching voltage. The switched varactor circuit may have a further characterization by which the first circuit node is coupled to an anode of a second varactor, and wherein a cathode of the second varactor is coupled to the second circuit node. The switched varactor circuit may have a further characterization by which when the bipolar transistor is substantially conducting, the capacitance value at the first circuit node is substantially equal to a sum of a capacitance of the first varactor and a capacitance of the second varactor. The switched varactor circuit may have a further characterization by which when the bipolar transistor is substantially conducting, the first resistive element directs a current received at the first circuit node from the first conducting terminal of the bipolar transistor to the second conducting terminal of the bipolar transistor. The switched varactor circuit may have a further characterization by which when the bipolar transistor is substantially non-conducting, the capacitance value at the first circuit node is substantially equal to a capacitance of the second varactor. The switched varactor circuit may have a further characterization by which the first circuit node is coupled to a first terminal of a second resistive element and a first terminal of a capacitor, wherein a second terminal of the second resistive element is coupled to a first power supply terminal. The switched varactor circuit may have a further characterization by which the switched varactor circuit is for use with a voltage controlled oscillator (VCO), and wherein the switching voltage has a first magnitude corresponding to a first range of frequencies of the VCO and a second magnitude corresponding to a second range of frequencies of the VCO, wherein the first range of frequencies is different from the second range of frequencies. The switched varactor circuit may further comprise a second resistive element having a first terminal coupled to the anode of the first varactor and a second terminal coupled to a first power supply terminal. The switched varactor circuit may have a further characterization by which the bipolar transistor is characterized as a hetero-junction bipolar transistor, and the first conducting terminal is characterized as an emitter terminal and the second conducting terminal is characterized as a collector terminal.

Described also is a switched varactor circuit for use at least one operating frequency. The switched varactor circuit includes a first resistive element having a first terminal and a second terminal, wherein the first terminal is coupled to receive a switching voltage. The switched varactor circuit further includes a hetero-junction bipolar transistor (HBT) having a base terminal, an emitter terminal, and a collector terminal, wherein the base terminal of the HBT is coupled to a second terminal of the first resistive element, and wherein the emitter terminal is coupled to a first circuit node. The switched varactor circuit further includes a first varactor having an anode coupled to the collector terminal of the HBT and a cathode coupled to a second circuit node, and wherein a capacitance value at the first circuit node is a function of the switching voltage, and wherein the first circuit node is coupled to an anode of a second varactor and the second circuit node is coupled to a cathode of the second varactor. The switched varactor circuit has a further characterization by which when the HBT is substantially conducting, the capacitance value at the first circuit node is substantially equal to a sum of a capacitance of the first varactor and a capacitance of the second varactor. The switched varactor circuit has a further characterization by which when the HBT is substantially non-conducting, the capacitance value at the first circuit node is substantially equal to a capacitance of the second varactor. The switched varactor circuit may further comprise a second resistive element having a first terminal coupled to the anode of the first varactor and a second terminal coupled to a first power supply terminal. The switched varactor may have a further characterization by which the first circuit node is coupled to a first terminal of a second resistive element, wherein a second terminal of the second resistive element is coupled to the first power supply terminal. The switched varactor may have a further characterization by which when the HBT is substantially non-conducting, the first varactor and the second varactor are coupled in parallel with each other between the second circuit node and the first power supply terminal. The switched varactor may have a further characterization by which the first circuit node is coupled to a first terminal of a second resistive element and a first terminal of a capacitor, wherein a second terminal of the second resistive element is coupled to the first power supply terminal. The switched varactor may have a further characterization by which the switched varactor circuit is for use with a voltage controlled oscillator (VCO), and wherein the switching voltage has a first magnitude corresponding to a first range of frequencies of the VCO and a second magnitude corresponding to a second range of frequencies of the VCO, wherein the first range of frequencies is different from the second range of frequencies.

Also described is a differential voltage controlled oscillator (VCO) for providing at least one operating frequency that includes a first switched varactor circuit and a second switched varactor circuit. The first varactor circuit includes a first resistive element having a first terminal and a second terminal, wherein the first terminal is coupled to receive a switching voltage. The first varactor circuit further includes a first hetero-junction bipolar transistor (HBT) having a base terminal, a first conducting terminal, and a second conducting terminal, wherein the base terminal of the HBT is coupled to a second terminal of the first resistive element, and wherein the first conducting terminal is coupled to a first circuit node. The first varactor circuit further includes a first varactor having an anode coupled to the second conducting terminal of the HBT and a cathode coupled to a second circuit node, wherein a capacitance value at the first circuit node is a function of the switching voltage. The first varactor circuit further includes a second varactor, wherein the first circuit node is coupled to an anode of the second varactor and the second circuit node is coupled to a cathode of the second varactor. The second varactor circuit includes a second resistive element having a first terminal and a second terminal, wherein the first terminal is coupled to receive the switching voltage. The second varactor circuit further includes a second hetero-junction bipolar transistor (HBT) having a base terminal, a first conducting terminal, and a second conducting terminal, wherein the base terminal of the second HBT is coupled to a second terminal of the second resistive element, and wherein the first conducting terminal of the second HBT is coupled to a third circuit node. The second varactor circuit further includes a third varactor having an anode coupled to the second conducting terminal of the second HBT and a cathode coupled to the second circuit node, wherein a capacitance value at the third circuit node is a function of the switching voltage. The second varactor circuit further includes a fourth varactor, wherein the third circuit node is coupled to an anode of the fourth varactor and the second circuit node is coupled to a cathode of the fourth varactor. The switched varactor may have a further characterization by which when the first HBT is substantially non-conducting, the capacitance value at the first circuit node is substantially equal to a capacitance of the second varactor, and when the second HBT is substantially non-conductive, the capacitance value at the third circuit node is substantially equal to a capacitance of the fourth varactor. The switched varactor may have a further characterization by which when the first HBT is substantially conducting, the capacitance value at the first circuit node is substantially equal to a sum of a capacitance of the first varactor and a capacitance of the second varactor, and when the second HBT is substantially conductive, the capacitance value at the third circuit node is substantially equal to a sum of a capacitance of the third varactor and a capacitance of the fourth varactor. The switched varactor may have a further characterization by which the first switched varactor circuit further includes a third resistive element having a first terminal coupled to the anode of the first varactor and a second terminal coupled to a first power supply terminal and the second switched varactor circuit further includes a fourth resistive element having a first terminal coupled to the anode of the third varactor and a second terminal coupled to the first power supply terminal.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

It is to be understood that the circuits depicted herein are merely exemplary. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. For example, a different type of switching device may be found to be effective. In one such example, the HBT may be replaced with two back-to-back diodes. This makes a bipolar transistor by placing two p-n diodes as "n-p-p-n" where the p-terminals will couple to resistor 52/62 of FIG. 2. The two "n-p-p-n" diodes will thus function as the HBT does in response to the switching voltage changing state. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A switched varactor circuit for use at at least one operating frequency, the switched varactor circuit comprising:
    a first resistive element having a first terminal and a second terminal, wherein the first terminal is coupled to receive a switching voltage;
    a bipolar transistor having a base terminal, a first conducting terminal, and a second conducting terminal, wherein the base terminal of the bipolar transistor is coupled to a second terminal of the first resistive element, and wherein the first conducting terminal is coupled to a first circuit node; and
    a first varactor having an anode coupled to the second conducting terminal of the bipolar transistor and a cathode coupled to a second circuit node, and wherein a capacitance value at the first circuit node is a function of the switching voltage,
    wherein:
        wherein the first circuit node is coupled to an anode of a second varactor, and wherein a cathode of the second varactor is coupled to the second circuit node; and
        the first circuit node is coupled to a first terminal of a second resistive element and a first terminal of a capacitor, wherein a second terminal of the second resistive element is coupled to a first power supply terminal.

2. The switched varactor circuit of claim 1, wherein when the bipolar transistor is substantially conducting, the capacitance value at the first circuit node is substantially equal to a sum of a capacitance of the first varactor and a capacitance of the second varactor.

3. The switched varactor circuit of claim 2, wherein when the bipolar transistor is substantially conducting, the first resistive element directs a current received at the first circuit node from the first conducting terminal of the bipolar transistor to the second conducting terminal of the bipolar transistor.

4. The switched varactor circuit of claim 1, wherein when the bipolar transistor is substantially non-conducting, the capacitance value at the first circuit node is substantially equal to a capacitance of the second varactor.

5. The switched varactor circuit of claim 1, wherein the switched varactor circuit is for use with a voltage controlled oscillator (VCO), and wherein the switching voltage has a first magnitude corresponding to a first range of frequencies of the VCO and a second magnitude corresponding to a second range of frequencies of the VCO, wherein the first range of frequencies is different from the second range of frequencies.

6. The switched varactor circuit of claim 1, further comprising:
    a second resistive element having a first terminal coupled to the anode of the first varactor and a second terminal coupled to a first power supply terminal.

7. The switched varactor circuit of claim 1, wherein the bipolar transistor is characterized as a hetero-junction bipolar transistor, and the first conducting terminal is characterized as an emitter terminal and the second conducting terminal is characterized as a collector terminal.

8. A switched varactor circuit for use at at least one operating frequency, the switched varactor circuit comprising:
    a first resistive element having a first terminal and a second terminal, wherein the first terminal is coupled to receive a switching voltage;
    a hetero-junction bipolar transistor (HBT) having a base terminal, an emitter terminal, and a collector terminal, wherein the base terminal of the HBT is coupled to a second terminal of the first resistive element, and wherein the emitter terminal is coupled to a first circuit node; and a first varactor having an anode coupled to the collector terminal of the HBT and a cathode coupled to a second circuit node, and wherein a capacitance value at the first circuit node is a function of the switching voltage, and wherein the first circuit node is coupled to an anode of a second varactor and the second circuit node is coupled to a cathode of the second varactor; and a second resistive element having a first terminal coupled to the anode of the first varactor and a second terminal coupled to a first power supply terminal, wherein:

when the HBT is substantially conducting, the capacitance value at the first circuit node is substantially equal to a sum of a capacitance of the first varactor and a capacitance of the second varactor, and when the HBT is substantially non-conducting, the capacitance value at the first circuit node is substantially equal to a capacitance of the second varactor.

9. The switched varactor circuit of claim 8, wherein the first circuit node is coupled to a first terminal of a second resistive element, wherein a second terminal of the second resistive element is coupled to the first power supply terminal.

10. The switched varactor circuit of claim 9, wherein when the HBT is substantially non-conducting, the first varactor and the second varactor are coupled in parallel with each other between the second circuit node and the first power supply terminal.

11. The switched varactor circuit of claim 8, wherein the switched varactor circuit is for use with a voltage controlled oscillator (VCO), and wherein the switching voltage has a first magnitude corresponding to a first range of frequencies of the VCO and a second magnitude corresponding to a second range of frequencies of the VCO, wherein the first range of frequencies is different from the second range of frequencies.

12. The switched varactor circuit of claim 8, wherein the second circuit node is coupled to receive a tuning voltage.

13. A switched varactor circuit for use at at least one operating frequency, the switched varactor circuit comprising:

a first resistive element having a first terminal and a second terminal, wherein the first terminal is coupled to receive a switching voltage;

a hetero-junction bipolar transistor (HBT) having a base terminal, an emitter terminal, and a collector terminal, wherein the base terminal of the HBT is coupled to a second terminal of the first resistive element, and wherein the emitter terminal is coupled to a first circuit node; and a first varactor having an anode coupled to the collector terminal of the HBT and a cathode coupled to a second circuit node, and wherein a capacitance value at the first circuit node is a function of the switching voltage, and wherein the first circuit node is coupled to an anode of a second varactor and the second circuit node is coupled to a cathode of the second varactor, wherein:

when the HBT is substantially conducting, the capacitance value at the first circuit node is substantially equal to a sum of a capacitance of the first varactor and a capacitance of the second varactor, and when the HBT is substantially non-conducting, the capacitance value at the first circuit node is substantially equal to a capacitance of the second varactor; and the first circuit node is coupled to a first terminal of a second resistive element and a first terminal of a capacitor, wherein a second terminal of the second resistive element is coupled to the first power supply terminal.

14. A differential voltage controlled oscillator (VCO) for providing at least one operating frequency, the differential VCO comprising:

a first switched varactor circuit comprising:

a first resistive element having a first terminal and a second terminal, wherein the first terminal is coupled to receive a switching voltage;

a first hetero-junction bipolar transistor (HBT) having a base terminal, a first conducting terminal, and a second conducting terminal, wherein the base terminal of the HBT is coupled to a second terminal of the first resistive element, and wherein the first conducting terminal is coupled to a first circuit node;

a first varactor having an anode coupled to the second conducting terminal of the HBT and a cathode coupled to a second circuit node, wherein a capacitance value at the first circuit node is a function of the switching voltage, and a second varactor, wherein the first circuit node is coupled to an anode of the second varactor and the second circuit node is coupled to a cathode of the second varactor; and a second switched varactor circuit comprising:

a second resistive element having a first terminal and a second terminal, wherein the first terminal is coupled to receive the switching voltage;

a second hetero-junction bipolar transistor (HBT) having a base terminal, a first conducting terminal, and a second conducting terminal, wherein the base terminal of the second HBT is coupled to a second terminal of the second resistive element, and wherein the first conducting terminal of the second HBT is coupled to a third circuit node;

a third varactor having an anode coupled to the second conducting terminal of the second HBT and a cathode coupled to the second circuit node, wherein a capacitance value at the third circuit node is a function of the switching voltage, and a fourth varactor, wherein the third circuit node is coupled to an anode of the fourth varactor and the second circuit node is coupled to a cathode of the fourth varactor, wherein:

the first switched varactor circuit further comprises:

a third resistive element having a first terminal coupled to the anode of the first varactor and a second terminal coupled to a first power supply terminal, and the second switched varactor circuit further comprises:

a fourth resistive element having a first terminal coupled to the anode of the third varactor and a second terminal coupled to the first power supply terminal.

15. The differential VCO of claim 14, wherein when the first HBT is substantially non-conducting, the capacitance value at the first circuit node is substantially equal to a capacitance of the second varactor, and when the second HBT is substantially non-conductive, the capacitance value at the third circuit node is substantially equal to a capacitance of the fourth varactor.

16. The differential VCO of claim 14, wherein when the first HBT is substantially conducting, the capacitance value at the first circuit node is substantially equal to a sum of a capacitance of the first varactor and a capacitance of the second varactor, and when the second HBT is substantially conductive, the capacitance value at the third circuit node is substantially equal to a sum of a capacitance of the third varactor and a capacitance of the fourth varactor.

* * * * *